(12) United States Patent
Banerjee et al.

(10) Patent No.: US 12,073,919 B2
(45) Date of Patent: Aug. 27, 2024

(54) DUAL READ PORT LATCH ARRAY BITCELL

(71) Applicant: Advanced Micro Devices, Inc., Santa Clara, CA (US)

(72) Inventors: Arijit Banerjee, Austin, TX (US); John J. Wuu, Fort Collins, CO (US); Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/359,445

(22) Filed: Jun. 25, 2021

(65) Prior Publication Data

US 2022/0415377 A1 Dec. 29, 2022

(51) Int. Cl.
| | |
|---|---|
| *G11C 8/16* | (2006.01) |
| *G06F 30/392* | (2020.01) |
| *G11C 11/418* | (2006.01) |
| *G11C 11/419* | (2006.01) |

(52) U.S. Cl.
CPC .............. *G11C 8/16* (2013.01); *G06F 30/392* (2020.01); *G11C 11/418* (2013.01); *G11C 11/419* (2013.01)

(58) Field of Classification Search
CPC ....... G11C 8/16; G11C 11/418; G11C 11/419; G06F 30/392
USPC .................................................. 365/230.05
See application file for complete search history.

(56) References Cited

U.S. PATENT DOCUMENTS

| | | | |
|---|---|---|---|
| 4,990,999 A | 2/1991 | Oishi et al. | |
| 5,172,335 A | 12/1992 | Sasaki et al. | |
| 5,263,002 A | 11/1993 | Suzuki et al. | |
| 6,560,160 B1 | 5/2003 | Grace | |
| 6,845,059 B1 | 1/2005 | Wordeman et al. | |
| 8,320,163 B2 | 11/2012 | Lee | |
| 9,401,200 B1 * | 7/2016 | Chan | H10B 10/12 |
| 9,916,889 B1 * | 3/2018 | Duong | H03K 19/00 |

(Continued)

FOREIGN PATENT DOCUMENTS

| | | |
|---|---|---|
| EP | 0929898 B1 | 11/2001 |
| WO | 9814950 A1 | 4/1998 |

OTHER PUBLICATIONS

International Search Report in International Application No. PCT/IB97/01388, mailed Mar. 3, 1998, 2 pages.
Banerjee et al., U.S. Appl. No. 17/359,446, entitled "Split Read Port Latch Array Bit Cell", filed Jun. 25, 2021, 47 pages.
Invitation to Pay Additional Fees, Communication Relating to the Results of the Partial International Search and Provisional Opinion Accompanying the Partial Search Result in International Application No. PCT/US2022/036516, mailed Oct. 17, 2022, 11 pages.

(Continued)

*Primary Examiner* — Sung Il Cho
(74) *Attorney, Agent, or Firm* — Kowert, Hood, Munyon, Rankin & Goetzel, P.C.; Rory D. Rankin (57) ABSTRACT

An apparatus and method for providing efficient floor planning, power, and performance tradeoffs of memory accesses. A dual read port and single write port memory bit cell uses two asymmetrical read access circuits for conveying stored data on two read bit lines. The two read bit lines are pre-charged to different voltage reference levels. The layout of the memory bit cell places the two read bit lines on an opposed edge from the single write bit line. The layout uses a dummy gate placed over both p-type diffusion and n-type diffusion between the edges. The layout has a same number of p-type transistors as n-type transistors despite using asymmetrical read access circuits. The layout also has a contacted gate pitch that is one more than the number of p-type transistors.

15 Claims, 8 Drawing Sheets

(56) References Cited

U.S. PATENT DOCUMENTS

| | | | |
|---|---|---|---|
| 2006/0250880 | A1 | 11/2006 | Ramaraju et al. |
| 2009/0244950 | A1 | 10/2009 | Nii |
| 2011/0216615 | A1 | 9/2011 | Nii |
| 2015/0029782 | A1* | 1/2015 | Jung .................... G11C 11/419 |
| | | | 365/154 |
| 2015/0063040 | A1 | 3/2015 | Chan et al. |
| 2015/0248927 | A1* | 9/2015 | Fujiwara .................. G11C 5/06 |
| | | | 365/72 |
| 2016/0064067 | A1 | 3/2016 | Mojumder et al. |
| 2016/0064068 | A1* | 3/2016 | Mojumder .......... H01L 29/1054 |
| | | | 365/156 |
| 2016/0351252 | A1 | 12/2016 | Fujiwara et al. |
| 2019/0325946 | A1 | 10/2019 | Lu |
| 2019/0385672 | A1* | 12/2019 | Sinangil ................ G11C 11/418 |
| 2021/0158864 | A1 | 5/2021 | Fujiwara et al. |

OTHER PUBLICATIONS

Invitation to Pay Additional Fees, Communication Relating to the Results of the Partial International Search and Provisional Opinion Accompanying the Partial Search Result in International Application No. PCT/US2022/036525, mailed Oct. 17, 2022, 11 pages.
Non-Final Office Action in U.S. Appl. No. 17/359,446, mailed Nov. 8, 2022, 10 pages.
International Search Report and Written Opinion in International Application No. PCT/US2022/036516, mailed Dec. 12, 2022, 19 pages.
International Search Report and Written Opinion in International Application No. PCT/US2022/036525, mailed Dec. 13, 2022, 20 pages.

* cited by examiner

DUAL READ PORT LATCH ARRAY BITCELL

BACKGROUND

Description of the Relevant Art

Generally speaking, a variety of semiconductor chips include at least one processing unit coupled to a memory. The processing unit processes instructions by fetching instructions and data, decoding instructions, executing instructions, and storing results. The processing unit sends memory access requests to the memory for fetching instructions, fetching data, and storing results of computations. In some designs, the processing unit and the memory are on a same die such as a system-on-a-chip (SOC), whereas, in other designs, the processing unit and the memory are on different dies within a same package such as a multi-chip-module (MCM) system-in-a-package (SIP). Static random access memory (SRAM) is commonly used for the memory. The SRAM includes an array of many memory bit cells and surrounding circuitry used for accessing values stored in the array.

The die or the package may include other units or components in addition to the processing unit and the memory. The dimensions of the individual components have limits in order to place all of the components on a same die or a same package. For several types of memory, such as the SRAM, the dimensions may exceed limits for efficient placement. The dimensions of the memory, such as the height and/or the width, may be large enough that they interfere with the placement of other components. In some cases, the other components may not even fit within the same die or the same package. Consequently, the chip may be rendered inoperable without significant redesign.

In view of the above, efficient methods and apparatuses for providing efficient floor planning, power, and performance tradeoffs of memory accesses are desired.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods for providing efficient floor planning, power, and performance tradeoffs of memory accesses are contemplated. A memory array (or array) utilizes multiple memory bit cells arranged as multiple rows and multiple columns. At least a portion of these multiple memory bit cells utilize asymmetrical read access circuits and dual read ports. As used herein, "an asymmetrical circuit" refers to a circuit that includes a number of p-type transistors different from a number of n-type transistors. The memory bit cell utilizes at least a first asymmetrical read access circuit and a second asymmetrical read access circuit to provide requested data on corresponding read bit lines. In some implementations, a first asymmetrical read access circuit of the memory bit cell conveys requested data on a first read bit line. This first read bit line was previously pre-charged to the ground reference level. This first asymmetrical read access circuit includes more p-type transistors than n-type transistors. In some implementations, the first asymmetrical read access circuit includes only p-type transistors.

A second asymmetrical read access circuit of the memory bit cell conveys requested data on a second read bit line that was previously pre-charged to the power supply reference level. This second asymmetrical read access circuit includes more n-type transistors than p-type transistors. By not using symmetrical read access circuits that include a same number of p-type transistors as a number of n-type transistors, the memory bit cells reduce the on-die area used for placement of the memory bit cells in the floorplan. Additionally, each read bit line is connected to a diffusion region of a single transistor drain connection per pair of bit cells by sharing that diffusion region along the bit cell edge (either a p-type transistor or an n-type transistor). Therefore, the capacitive loading on the corresponding read bit line is reduced.

The semiconductor layout (or layout) of the memory bit cell that includes asymmetrical read access circuits uses drain regions on the outermost edges of the layout for placement of the two read bit lines. The placement of these drain regions allows sharing of nodes between adjacent memory bit cells. Further, the layout uses a dummy gate, which is a structure that includes an insulting layer, rather than an active region, underneath the metal gate. This insulating layer provides electrical isolation between source/drain regions on either side of the metal gate of the dummy gate structure. The placement of metal layers and other structures in the layout provides a number of contacted gate pitches (CPP) of the layout that is one more than the number of p-type transistors in the layout. A further description of both the circuits and the layout of the adjacent memory bit cells is provided in the below discussion.

Figure 1:
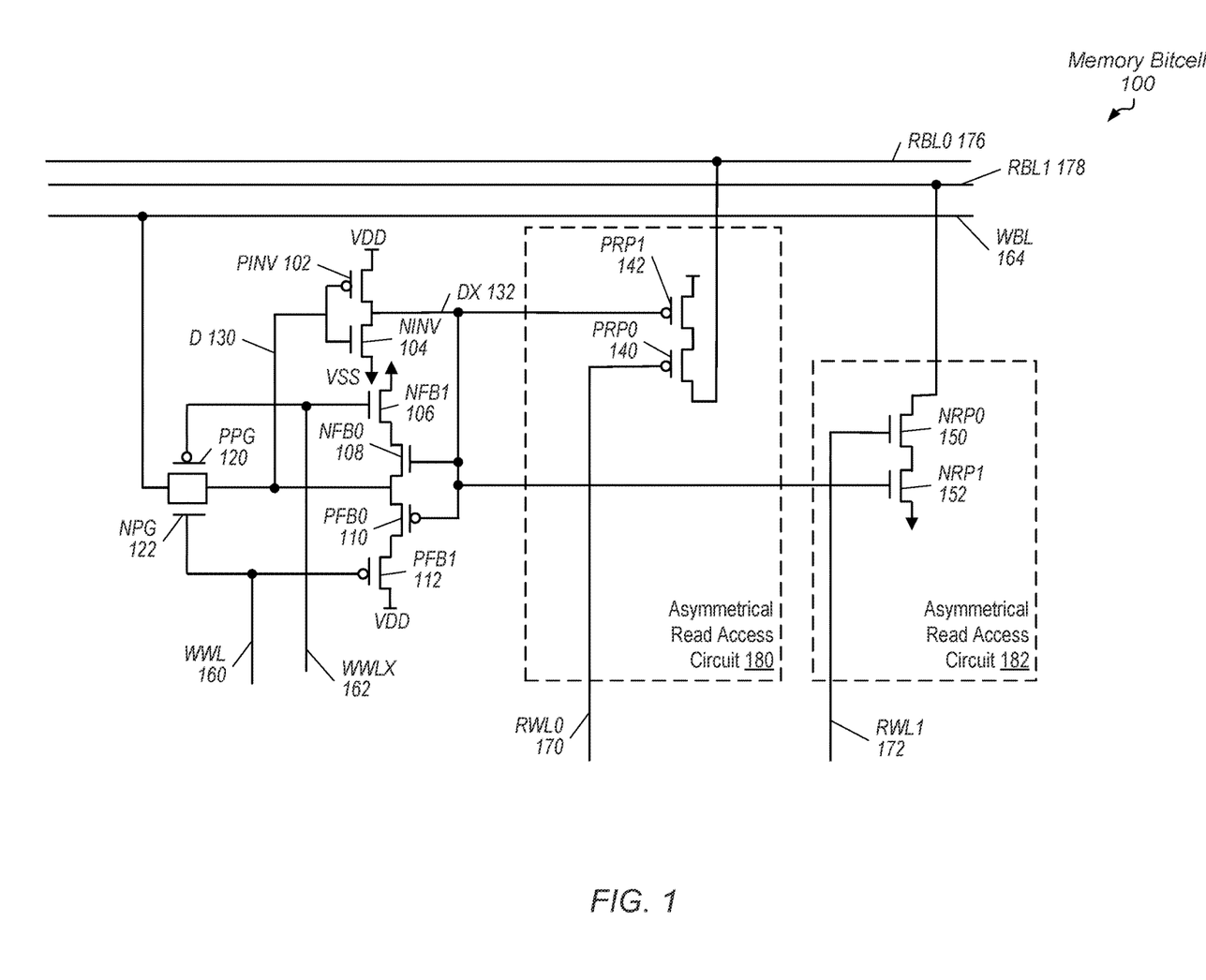
FIG. 1 is a generalized diagram of a memory bit cell that includes asymmetrical read access circuits and dual read ports.

Turning to FIG. 1, a generalized block diagram of one implementation of a memory bit cell 100 that includes asymmetrical read access circuits and dual read ports is shown. In the implementation shown, data storage by a latching element is provided by the memory bit cell 100. For example, the devices 102-112 provide data storage using a back-to-back configuration of an inverter and a tristate inverter. The inverter is implemented with devices 102-104. The tristate inverter is implemented with devices 106-112. The devices 140, 142, 150 and 152 provide two read access circuits for the memory bit cell 100 such that memory bit cell 100 is a dual read port bit cell. In various implementations, the devices of memory bit cell 100 are transistors. In some implementations, the transistors are planar metal oxide semiconductor (MOS) field effect transistors (FETs). In other implementations, the devices (or transistors) in the memory bit cell 100 are non-planar transistors. Non-planar transistors are a recent development in semiconductor processing for reducing short channel effects. Tri-gate transistors, Fin field effect transistors (FETs) and gate all around (GAA) transistors are examples of non-planar transistors.

The memory bit cell 100 is one implementation of a static RAM (SRAM). In other implementations, another one of various types of RAM cells is used. This "memory bit cell" may also be referred to as the "memory bit cell" and the "SRAM bit cell." In various implementations, the memory bit cell 100 is copied many times and arranged in an array of rows and columns for a memory. The array includes external circuitry (not shown) such as one or more of row decoders, column decoders, a sense amplifier, pre-charge circuitry, and sequential elements such as latches or flip-flop circuits for storing read access data and write access data.

As used herein, a Boolean logic high level is also referred to as a logic high level. Similarly, a Boolean logic low level is also referred to as a logic low level. In various implementations, the logic high level is equal to a power supply reference level and the logic low level is equal to a ground reference level. As used herein, a circuit node or line is "asserted" when the node or line stores a voltage level that enables a transistor that receives the voltage level. For example, an n-type transistor is enabled when the n-type transistor receives a positive non-zero voltage level on its gate terminal that is at least a threshold voltage above a voltage level on its source terminal. As used herein, the circuit node or line is "negated" when the node or line stores a voltage level that disables a transistor that receives the voltage level. An n-type transistor is disabled when the n-type transistor receives a voltage level on its gate terminal that is a threshold voltage below a voltage level on its source terminal. Similarly, a p-type transistor is enabled when the p-type transistor receives a voltage level on its gate terminal that is at least a threshold voltage below a voltage level on its source terminal. The p-type transistor is negated when the p-type transistor receives a voltage level on its gate terminal that is at least a threshold voltage above a voltage level on its source terminal.

When the data storage node D 130 of the memory bit cell 100 has a logic high level, the n-type transistor 104 is enabled and the p-type transistor 102 is disabled. The enabled n-type transistor 104 discharges the node DX 132, which enables the p-type transistor 110 and disables the n-type transistor 108. When the data storage node D 130 of the memory bit cell 100 has a logic low level, the n-type transistor 104 is disabled and the p-type transistor 102 is enabled. The enabled p-type transistor 102 charges the node DX 132, which enables the n-type transistor 108 and disables the p-type transistor 110. As used herein, an "n-type transistor" is also referred to as an "n-type device," an "n-type MOSFET," and an "nfet." Additionally, a "p-type transistor" is also referred to as a "p-type device," a "p-type MOSFET," and a "pfet." Therefore, the n-type transistor 108 is also referred to as the nfet 108 and the p-type transistor 110 is also referred to as the pfet 110. It is noted that the nfet 108 is also labeled as NFB0 108 in FIG. 1. The labels used in FIG. 1, such as "NFB0 108" helps to identify transistors and circuit nodes in the circuit diagram of FIG. 1 and equivalent transistors and nodes in semiconductor layout diagrams used in later descriptions such as at least FIG. 2.

When a write operation is not occurring, each of the write word line (WWL) 160 and the complementary write word line (WWLX) 162 is negated. Accordingly, each of the n-type transistor 122 and the p-type transistor 120 of the pass gate is disabled, which electrically disconnects the word line WBL 164 from the node D 130 of the memory bit cell 100. Additionally, each of the n-type transistor 106 and the p-type transistor 112 is enabled, which allows one of the n-type transistor 108 and the p-type transistor 110 to both drive a particular voltage level on the node D 130 based on a voltage level of the node DX 132 and close the data storage loop of the memory bit cell 100. For example, when the node DX 132 stores a logic high level, the n-type transistor 108 is enabled and the p-type transistor 110 is disabled. The n-type transistor 106 is enabled due to the logic high level of WWLX 162, which is negated. The enabled n-type transistors 106 and 108 provide an electrical discharge path between the data storage node D 130 and the ground reference level indicated by "VSS," which maintains the logic low level on the data storage node D 130 and closes the data storage loop. Conversely, when the node DX 132 stores a logic low level, the n-type transistor 108 is disabled and the p-type transistor 110 is enabled. The p-type transistor 112 is enabled due to the logic low level of WWL 160, which is negated. The enabled p-type transistors 110 and 112 provide an electrical charging path between the data storage node D 130 and the power supply reference level indicated by "VDD," which maintains the logic high level on the data storage node D 130 and closes the data storage loop.

When a write operation is occurring, a row decoder (not shown) receives address information and enables a single row word line of multiple row word lines. In implementations utilizing memory banks, the row decoder (not shown) receives the address information and enables a particular word line of a targeted memory bank, which contains multiple row word lines. When the memory bit cell 100 is in the row corresponding to the enabled row word line, each of WWL 160 and WWLX 162 of memory bit cell 100 is asserted by external access circuitry. Accordingly, each of the p-type transistor 120 and the n-type transistor 122 of the pass gate is enabled. The enabled transistors 120 and 122 of the pass gate electrically connect the word line WBL 164 to the node D 130 of the memory bit cell 100. Therefore, the WBL 164 drives a voltage level to be stored on the node D 130. The write word line WWL 160 is also connected to other memory bit cells in a corresponding row of the array. Each of the n-type transistor 106 and the p-type transistor 112 is disabled, which electrically disconnects the data storage nodes D 130 and DX 132 from one another. In this implementation, the memory bit cell 100 is a single-ended write bit cell with a single write port. The bit line WBL 164 is driven with write data by an external sequential element and buffer circuitry that drives the write data on a column of the array. For write access operations, external circuitry drives a particular voltage level, such as a logic high level or a logic low level corresponding to input data, onto the bit line WBL 164 routed throughout a column. It is noted for memory bit cells not targeted by the write operation, the data storage remains unchanged.

For read access operations, in some implementations, external pre-charge transistors are disabled, the read word line is asserted, an external sense amplifier is enabled, and the external read latches are enabled to capture the data read from the targeted memory bit cells. The data stored by the latch element (transistors 102-112) of the memory bit cell 100 is gated from the read bit line RBL0 176 by the asymmetrical read access circuit 180. Similarly, the data stored by the latch element (transistors 102-112) of the memory bit cell 100 is gated from the read bit line RBL1 178 by the asymmetrical read access circuit 182. As used herein, "asymmetrical" refers to circuits that include a number of p-type transistors different from a number of n-type transistors.

In various implementations, the asymmetrical read access circuit 180 includes more p-type transistors than n-type transistors. In some implementations, the asymmetrical read access circuit 180 includes only p-type transistors. In such implementations, the asymmetrical read access circuit 180 does not include any n-type transistors. In the illustrated implementation, the asymmetrical read access circuit 180 includes two p-type transistors 140 and 142 connected in a series stack topology and zero n-type transistors. Therefore, the asymmetrical read access circuit 180 utilizes a number of p-type transistors, which is 2 in this case, different from a number of n-type transistors, which is 0 in this case. The inputs to the asymmetrical read access circuit 180 are the node DX 132 and the read word line RWL0 170. The output of the asymmetrical read access circuit 180 is the read bit line RBL0 176.

In various implementations, the asymmetrical read access circuit 182 includes more n-type transistors than p-type transistors. In some implementations, the asymmetrical read access circuit 182 includes only n-type transistors. In such implementations, the asymmetrical read access circuit 182 does not include any p-type transistors. In the illustrated implementation, the asymmetrical read access circuit 182 includes two n-type transistors 150 and 152 connected in a series stack topology and zero p-type transistors. Therefore, the asymmetrical read access circuit 182 utilizes a number of p-type transistors, which is 0 in this case, different from a number of n-type transistors, which is 2 in this case. The inputs to the asymmetrical read access circuit 182 are the node DX 132 and the read word line RWL1 172. The output of the asymmetrical read access circuit 180 is the read bit line RBL1 178.

The bit line RBL0 176 is pre-charged to a logic low level such as the ground reference level "VSS." After the pre-charge cycle (or phase) has ended, when the word line RWL0 170 is asserted, the p-type transistor 140 becomes enabled. Whether the p-type transistor 142 is enabled is based on the binary value stored on the node DX 132. When both p-type transistors 140 and 142 are enabled and the node DX 132 stores a logic low level, this series stack of p-type transistors 140 and 142 charge the bit line RBL0 176 to a logic high level.

Regarding the other asymmetrical read access circuitry of the memory bit cell 100, the bit line RBL1 178 is pre-charged to a logic high level such as the power supply reference level "VDD." After the pre-charge cycle (or phase) has ended, when the word line RWL1 172 is asserted, the n-type transistor 150 becomes enabled. Whether the n-type transistor 152 is enabled is based on the binary value stored on the node DX 132. When both n-type transistors 150 and 152 are enabled and the node DX 132 stores a logic high level, this series stack of n-type transistors 150 and 152 discharge the bit line RBL1 178 to a logic low level. Therefore, p-type transistors 140 and 142 provide an asymmetrical read access circuit that relies on only p-type transistors. This asymmetrical read access circuit uses no n-type transistors. The n-type transistors 150 and 152 provide an asymmetrical read access circuit that relies on only n-type transistors. This asymmetrical read access circuit uses no p-type transistors. This topology of memory bit cell 100 uses less transistors than a bit cell that uses full complementary tristate inverters to implement dual read ports.

Figure 2:
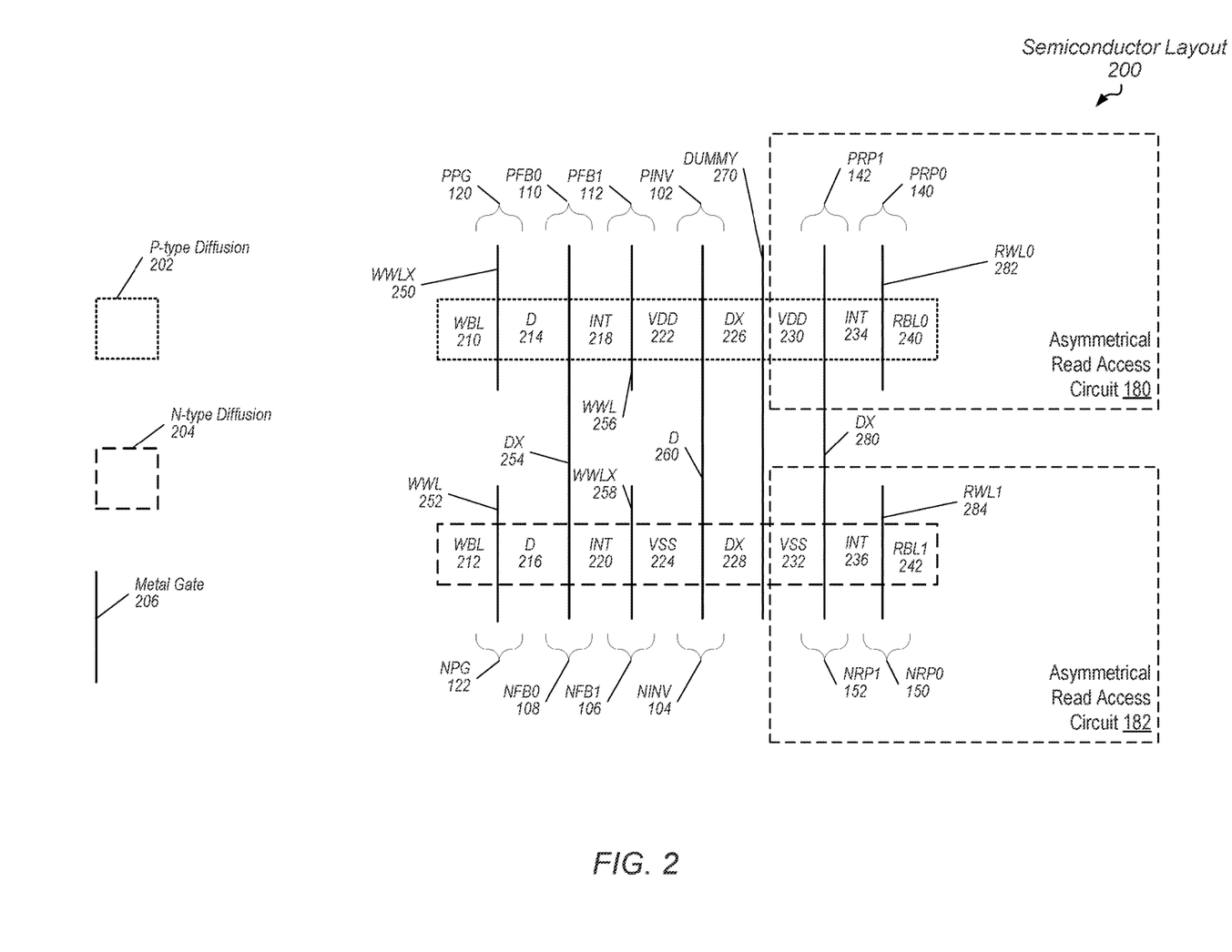
FIG. 2 is a generalized diagram of one implementation of semiconductor layout of a memory bit cell that includes asymmetrical read access circuits and dual read ports.

Referring to FIG. 2, a generalized block diagram of one implementation of semiconductor standard cell layout 200 of a memory bit cell that includes asymmetrical read access circuits and dual read ports is shown. Signals and circuitry described earlier are numbered identically. It is noted that the dashed boxes for the asymmetrical read access circuits 180 and 182 are used to highlight the layout elements of these circuits, and the dashed boxes are not part of the layout 200. Here, the p-type transistors (p-type transistors) are at the top of the standard cell layout 200 (or layout 200) and the n-type transistors (n-type transistors) are at the bottom of the standard cell layout 200. In the illustrated implementation, the standard cell layout 200 is for a dual read port and single write port memory bit cell with single-ended read and single-ended write capability. In various implementations, the standard cell layout 200 is used for the circuit topology of the memory bit cell 100 (of FIG. 1). As shown, the standard cell layout 200 uses metal gate 206 in a vertical direction and diffusion regions 202 and 204 used to define active regions in a horizontal direction. For example, p-type diffusion region 202 defines a p-type active region in the layout 200, whereas, the n-type diffusion region 204 defines an n-type active region in the layout 200. It is noted that it is possible to rotate the standard cell layout 200 to have a different orientation.

Similar to the transistors of memory bit cell 100 (of FIG. 1), in some implementations, the transistors in the layout 200 are planar metal oxide semiconductor (MOS) field effect transistors (FETs). In other implementations, the devices (or transistors) of the layout 200 are non-planar transistors such as tri-gate transistors, Fin field effect transistors (FETs), and gate all around (GAA) transistors. In some implementations, the source/drain regions are implemented with trench silicide contacts. Trench silicide contacts used for source/drain regions, signal routes in different metal layers, contacts and vias, and so forth are not shown in layout 200 for ease of illustration. As shown, the p-type transistors 102, 110, 112, 120, 140 and 142 are placed in a particular order. Similarly, the n-type transistors 104, 106, 108, 122, 150 and 152 are placed in a particular order. Despite using asymmetrical read access circuitry, the standard cell layout 200 includes both a number of p-type transistors equal to a number of n-type transistors and provides a contacted gate pitch that is one more than the number of p-type transistors (or the number of n-type transistors). The metric of a number of contacted gate (poly) pitches (CPP) is one metric used to characterize a density of semiconductor layout. In the illustrated implementation, layout 200 has six p-type transistors and six n-type transistors despite using asymmetrical read access circuitry. The layout 200 has a density equivalent to seven CPP.

Dummy gates are typically used to provide electrical isolation between regions. Although in various implementations, a dummy gate uses a metal gate, the gate region is formed over an insulation layer, rather than an active silicon layer such as an n-type or p-type diffusion layer. The isolation layer uses a silicon nitride layer, a silicon oxide layer, such as a silicon dioxide layer, or another type of dielectric layer. Therefore, should voltage levels be applied on the dummy gate and one or more of the regions on either side of the dummy gate, such as source/drain regions, no electrical path is provided and no current flows between the source/drain regions. The fabrication steps for the dummy gate ensures that an active transistor is not formed at the location in the layout of the dummy gate. In some implementations, standard cell layouts use dummy gates at the edges of the cell layout. In these cases, dummy gates are used to separate cells from one another. For example, an edge of a cell has a last active metal gate, followed by active diffusion, and then a dummy gate. In some designs, two adjacent cells share a dummy gate. However, as shown in the illustrated implementation, the standard cell layout 200 has no dummy gates at the edges. Rather, the standard cell layout 200 uses a dummy gate 270 in the middle of the layout.

At the left edge of the standard cell layout 200, the write bit line is placed. For example, at the left edge of layout 200, the source/drain region WBL 210 of the p-type transistor 120 is placed. Similarly, at the left edge of layout 200, the source/drain region WBL 212 of the n-type transistor 122 is placed. At the right edge of the standard cell layout 200, the two read bit lines are placed. For example, at the top right edge of layout 200, the drain region RBL0 240 of the p-type transistor 140 is placed. Similarly, at the bottom right edge of layout 200, the drain region RBL1 242 of the n-type transistor 150 is placed. Dummy gates are not placed at the left edge or the right edge of layout 200.

The source/drain regions 210-242 of the layout 200 are electrically equivalent to signals named in a similar manner and used in the memory bit cell 100 (of FIG. 1). Similarly, the metal gates 250-284 of the layout 200 are electrically equivalent to signals named in a similar manner and used in the memory bit cell 100 (of FIG. 1). However, here, the signals are physically disconnected at the source/drain regions and at the metal gates until further layers and contacts are placed to electrically connect nodes to one another. Therefore, signals that are named identically to one another in FIG. 2 and named identically with signals described earlier in the memory bit cell 100 (of FIG. 1) are numbered differently in the layout 200 due to the signals identifying different physical elements of layout 200. For example, the data storage nodes D 214 and D 216 are logically equivalent, but the p-type active region forming the source/drain region for node D214 does not physically abut with the n-type active region forming the source/drain region for node D 216. Therefore, the nodes D 214 and D 216 are not physically connected at the source/drain regions. However, the nodes D 214 and D 216 are physically connected after further layers, vias and contacts are placed by semiconductor fabrication steps.

When the semiconductor fabrication steps place the further metal layers, vias and contacts, which are not shown for ease of illustration, the nodes D 214 and D 216 become physically connected. This physical connection allows the nodes D 214 and D 216 to become electrically connected when voltage levels are applied to the layout 200. Similarly, the write word lines WWL 252 and WWL 256 are logically equivalent, but the metal gate of WWL 252 does not physically abut with the metal gate of WWL 256. Therefore, the write word lines WWL 252 and WWL 256 are not physically connected at the metal gates. However, the write word lines WWL 252 and WWL 256 are physically connected after further layers and contacts are placed by the by semiconductor fabrication steps. When the semiconductor fabrication steps place the further metal layers, vias and contacts, the write word lines WWL 252 and WWL 256 become physically connected. This physical connection allows the write word lines WWL 252 and WWL 256 to become electrically connected when voltage levels are applied to the layout 200.

Figure 3:
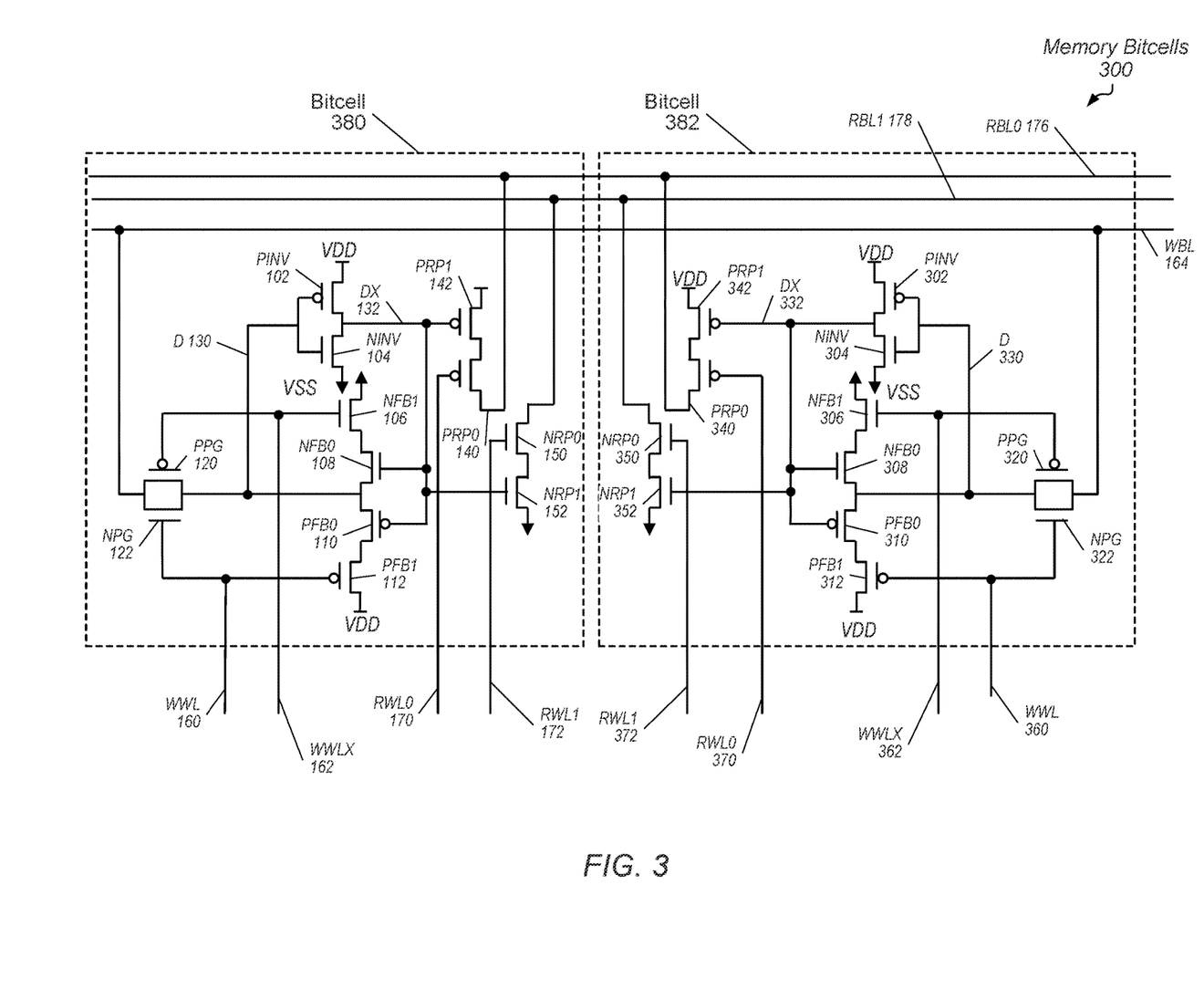
FIG. 3 is a generalized diagram of one implementation of adjacent memory bit cells that include asymmetrical read access circuits and dual read ports.

Turning now to FIG. 3, a generalized block diagram of one implementation of adjacent memory bit cells 300 that include asymmetrical read access circuits and dual read ports is shown. Signals and circuitry described earlier are numbered identically. In the illustrated implementation, two memory bit cells 380 and 382 are placed in an adjacent manner. In some implementations, the bit cells 380 and 382 are two adjacent bits of two different rows in a same column of an array. In one example, bit cell 380 is bit [4] of a data word stored in row 9 of a multi-row array and bit cell 382 is bit [4] of another data word stored in row 10 of the same multi-row array. Bit cells 380 and 382 share the read bit lines RBL0 176 and RBL1 178. Similarly, the bit cells share the write bit line WBL 164. The bit cell 380 uses the same transistors and topology as memory bit cell 100 (of FIG. 1). Similarly, the bit cell 382 uses the same transistors and topology as memory bit cell 100, but in a mirrored manner. As shown, bit cell 382 includes transistors 302-352 using a same electrical topology as transistors 102-152 of bit cell 380. Similarly, bit cell 382 receives control signals 360-372 in a similar manner as bit cell 380 receives control signals 160-172.

Figure 4:
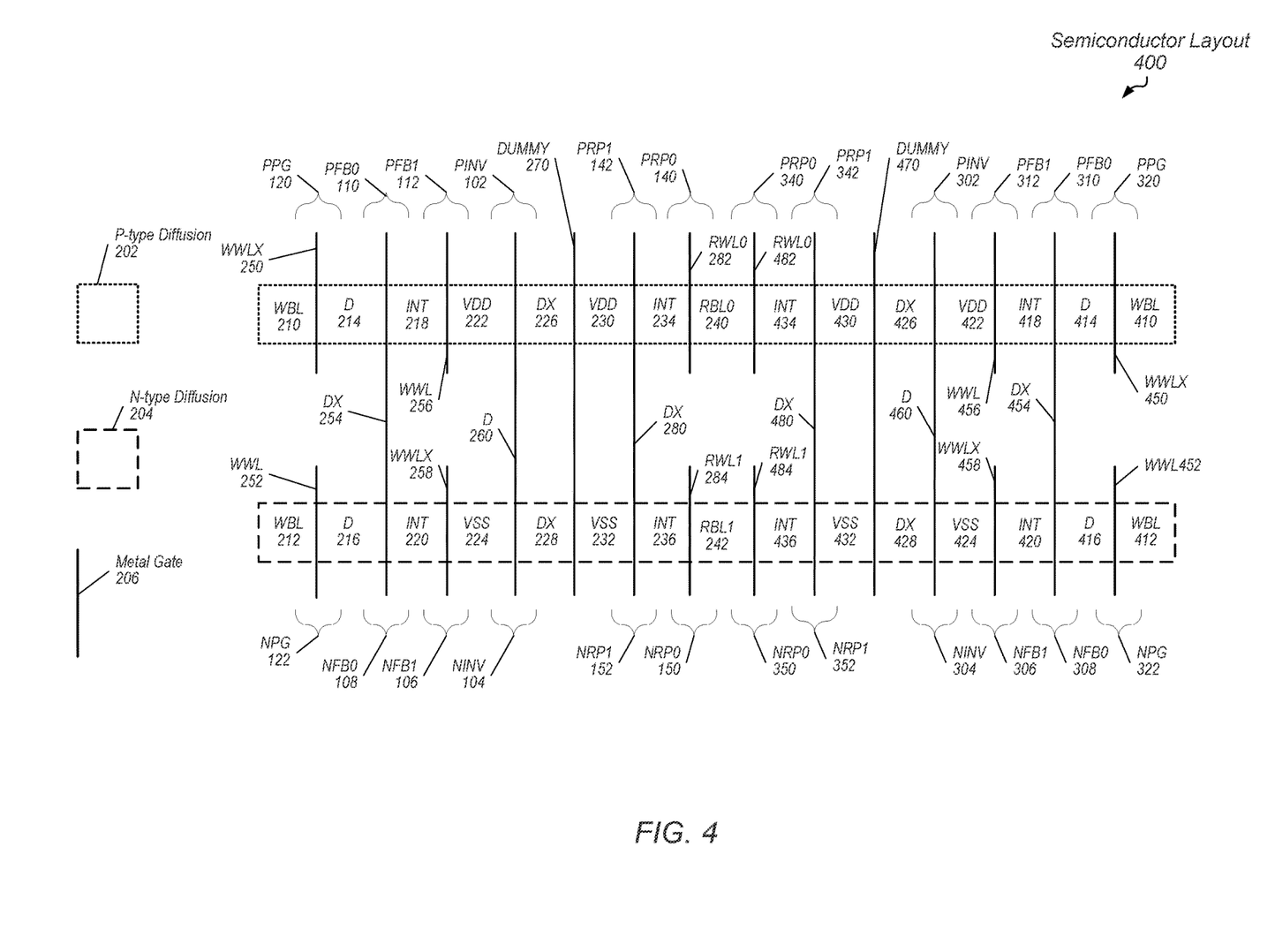
FIG. 4 is a generalized diagram of one implementation of semiconductor layout of adjacent memory bit cells that include asymmetrical read access circuits and dual read ports.

Referring to FIG. 4, a generalized block diagram of one implementation of semiconductor layout 400 of adjacent memory bit cells that include asymmetrical read access circuits and dual read ports is shown. Signals and circuitry described earlier are numbered identically. Here, the p-type transistors are at the top of the standard cell layout 400 and the n-type transistors are at the bottom of the standard cell layout 400. In the illustrated implementation, the standard cell layout 400 is for two dual read port, single write port memory bit cells with single-ended write. In some implementations, the bit cells are two adjacent bits of two different rows in a same column of an array. In an implementation, the standard cell layout 400 provides layout of the memory bit cells 300 (of FIG. 3). As shown, the standard cell layout 400 (or layout 400) includes transistors 102-152 and 302-352 utilizing source/drain regions 210-242 and 410-436 and receives control signals 250-284 and 450-484 received on metal gates.

Similar to the layout 200, signals that are named identically to one another in FIG. 4 and named identically with signals described earlier in the memory bit cell 100 (of FIG. 1) and the memory bit cells 300 (of FIG. 3) are numbered differently in the semiconductor layout 400 due to the signals identifying different physical elements of the semiconductor layout 400. For example, the write word lines WWL 452 and WWL 456 are logically equivalent, but the metal gate of WWL 452 does not physically abut with the metal gate of WWL 456. Therefore, the write word lines WWL 452 and WWL 456 are not physically connected at the metal gates. However, the write word lines WWL 452 and WWL 456 are physically connected after further layers and contacts are placed by the by semiconductor fabrication steps. When the semiconductor fabrication steps place the further metal layers, vias and contacts, the write word lines WWL 452 and WWL 456 become physically connected. This physical connection allows the write word lines WWL 452 and WWL 456 to become electrically connected when voltage levels are applied to the layout 400.

Similar to the standard cell layout 200 (or layout 200), the layout 400 does not use dummy gates at the outermost edges. Rather, the layout 400 uses dummy gates 270 and 470 in separate memory bit cells. In various implementations, dummy gate 470 is formed using similar fabrication steps used to form dummy gate 270. Similar to dummy gate 270, the dummy gate 470 in left floating in some implementations, whereas, in other implementations, one or more of the dummy gates 270 and 470 are connected to one of VDD and VSS. Despite using metal gates, the dummy gates 270 and 470 are formed over a dielectric layer, and consequently, are incapable of conducting current. Therefore, the source/drain region DX 226 is electrically isolated from the source/drain region VDD 230. Similarly, the source/drain region DX 228 is electrically isolated from the source/drain region VSS 232. Further, the source/drain region DX 426 is electrically isolated from the source/drain region VDD 430, and the source/drain region DX 428 is electrically isolated from the source/drain region VSS 432. The layout 400 provides sharing of the drain regions RBL0 240 and RBL1 242 used for the read bit lines. For example, the two p-type transistors 140 and 340 share the drain region RBL0 240. In a similar manner, the two n-type transistors 150 and 350 share the drain region RBL1 242. On both the left edge and the right edge, further sharing can occur with other layouts of other bit cells sharing the drain regions WBL 210, WBL 212, WBL 410 and WBL 412.

Figure 5:
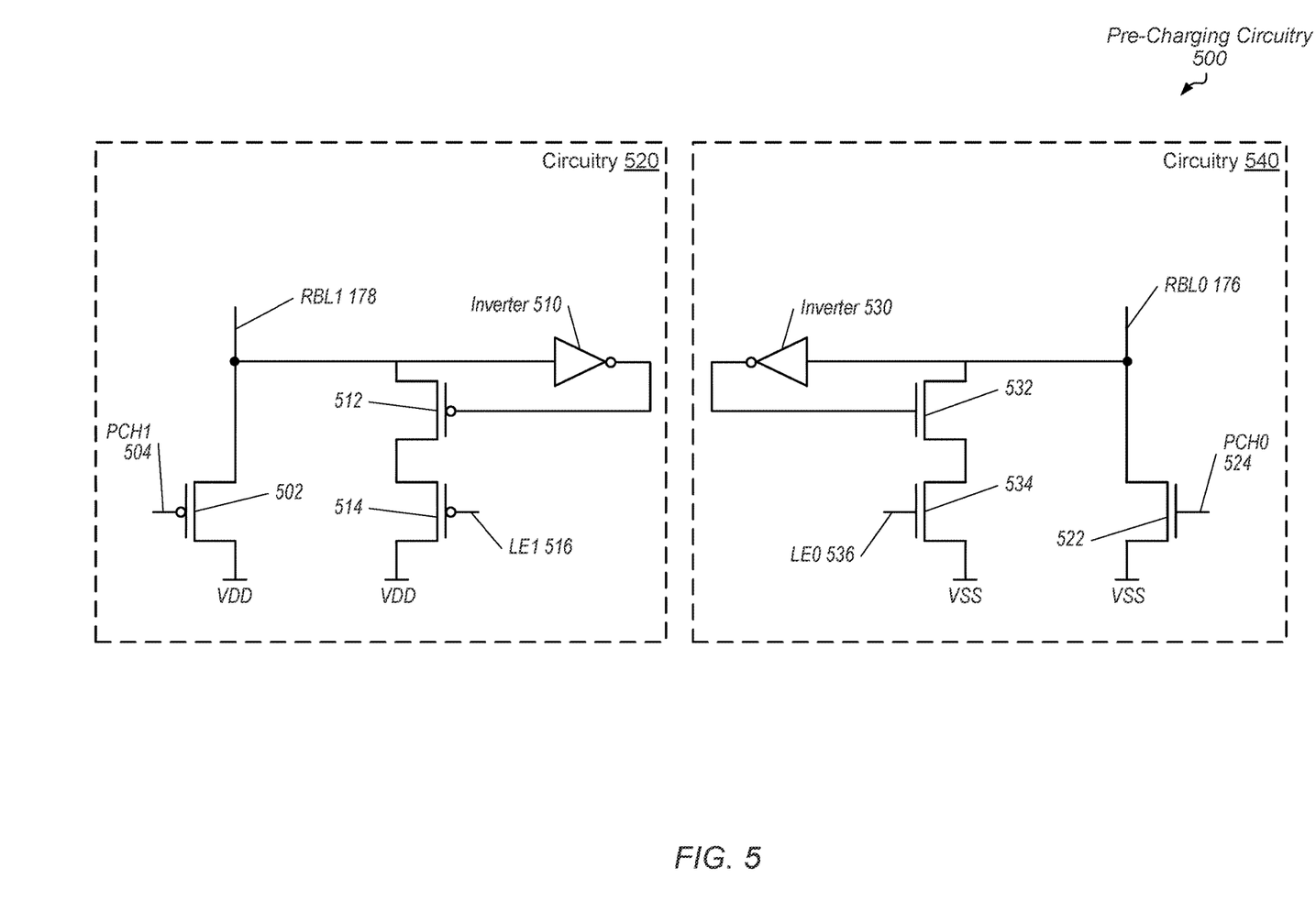
FIG. 5 is a generalized diagram of one implementation of pre-charging circuitry of a memory that utilizes memory bit cells with asymmetrical read access circuits and dual read ports.

Turning now to FIG. 5, a generalized block diagram of one implementation of pre-charging circuitry 500 is shown. Signal names previously described are numbered identically. For example, the read bit lines RBL0 176 and RBL1 178 are the read bit lines from the memory bit cell 100 (of FIG. 1). As shown, circuitry 500 includes pre-charging circuitry (or circuitry) for two read bit lines. Circuitry 520 pre-charges the read bit line RBL1 178. The read bit line RBL1 178 is connected to an asymmetrical read access circuit (not shown) that uses only n-type transistors. As shown earlier, an example of this asymmetrical read access circuit that uses only n-type transistors is the asymmetrical read access circuit 182 (of FIG. 1). Circuitry 520 includes the pre-charge p-type transistor 502, an inverter 510, and the p-type transistors 512 and 514 in a series stack topology. The pre-charge p-type transistor 502 receives a pre-charge control signal PCH1 504. The transistor 514 receives the control signal LE1 516. Circuitry 540 pre-charges the read bit line RBL0 176. The read bit line RBL0 176 is connected to an asymmetrical read access circuit (not shown) that uses only p-type transistors. As shown earlier, an example of this asymmetrical read access circuit that uses only p-type transistors is the asymmetrical read access circuit 180 (of FIG. 1). Circuitry 540 includes the pre-charge transistor 522, an inverter 530, and the n-type transistors 532 and the 534 in a series stack topology. The pre-charge transistor 522 receives a pre-charge control signal PCH0 524, and the transistor 522 receives the control signal PCH0 524. A further description of the operation of the circuitry 520 is provided in the below discussion. Similar steps are used to operate the circuitry 540.

During a pre-charge phase, the control signal PCH1 504 is asserted, the p-type transistor 502 is enabled, and the enabled transistor 502 creates an electrically conducting path between the power supply voltage reference level "VDD" and the read bit line RBL1 178. When RBL1 178 is pre-charged to the power supply reference level, the inverter 510 discharges the gate terminal of the p-type transistor 512, which enables the transistor 512. The transistor 512 is used as a keeper transistor. In some implementations, circuitry 520 uses a single keeper transistor, such as transistor 512, with no transistor 514. In other implementations, circuitry 520 uses the series stack as shown with the two p-type transistors 512 and 514 providing one of a variety of split keeper (or dual keeper) schemes. For example, the two p-type transistors 512 and 514 provide one of a variety of delayed onset keeper circuitry. During an evaluate phase, the control signal PCH1 504 is negated, and the transistor 502 is disabled. The voltage level on the read bit line RBL1 178 is based at least on a voltage level provided by the asymmetrical read access circuitry of a selected bit cell.

Figure 6:
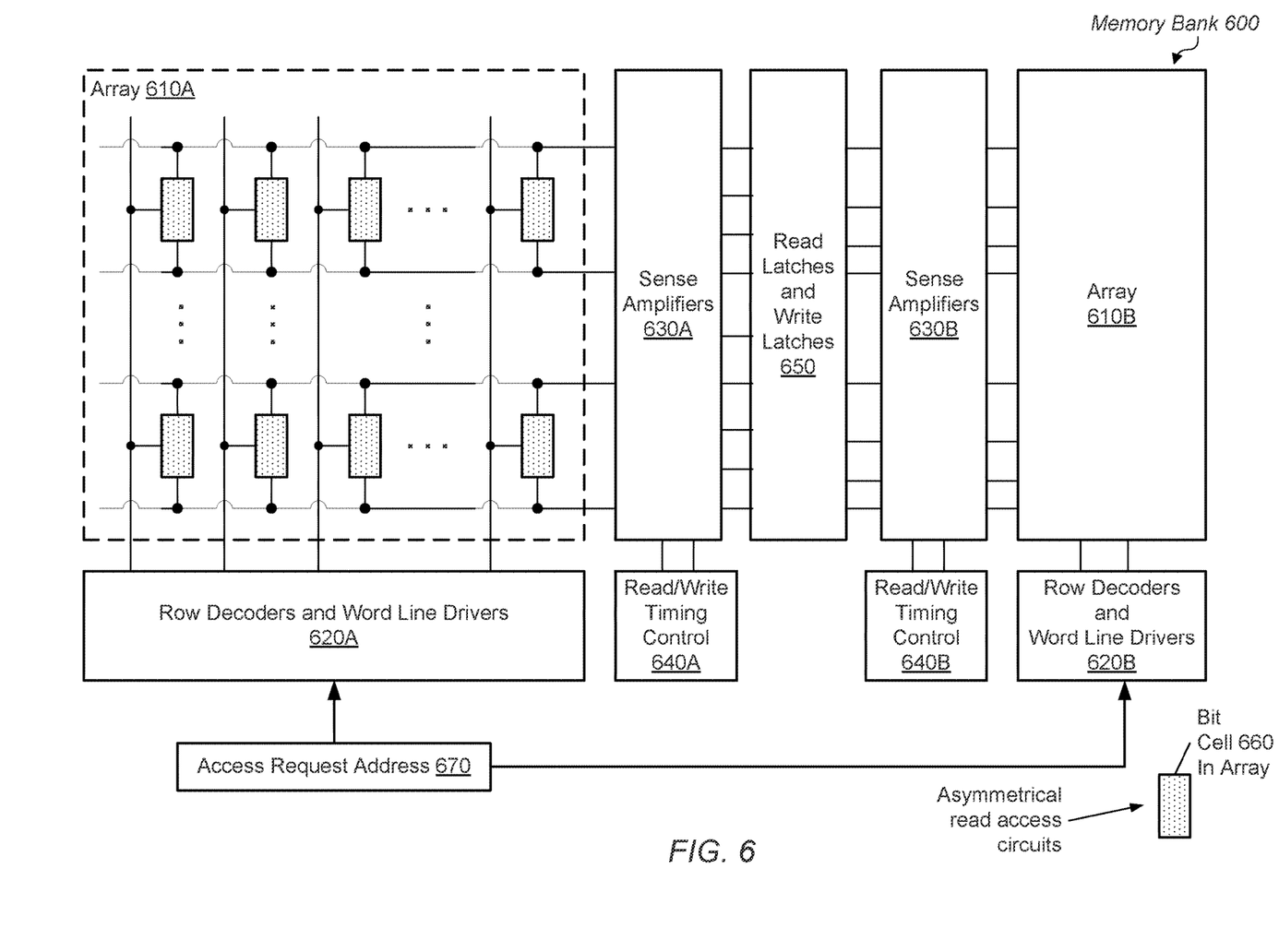
FIG. 6 is a block diagram of an implementation of a memory bank that utilizes memory bit cells with asymmetrical read access circuits and dual read ports.

Turning now to FIG. 6, a generalized block diagram of one implementation of a memory bank 600 is shown. In various implementations, a memory is organized as multiple memory banks, and a memory macro block includes both a left bank and a right bank. In some implementations, the bank 600 is one of the left bank or the right bank of the memory macro block. Although "left" and "right" are used to describe the memory banks, other notations may be used such as a "top bank" and a "bottom bank." As shown, the memory bank 600 includes arrays 610A-610B, row decoders 620A-620B, sense amplifiers 630A-630B between the arrays 610A-610B, read and write timing control logic 640A-640B, and read latches and write latches in block 650. It is noted that, in some implementations, multiple banks are accessed concurrently in a same clock cycle or a same pipeline stage. The access includes one of a read access and a write access. In such implementations, bank address decoders select the corresponding banks to access.

In various implementations, each of the blocks 610A-610B, 620A-620B, 630A-630B, 640A-640B and 650 in the memory bank 600 is communicatively coupled to another one of the blocks. For example, direct connections are used wherein routing occurs through another block. Alternatively, staging of signals is done in an intermediate block. In various implementations, each of the arrays 610A-610B includes multiple memory bit cells 660 arranged in a tiled format. In some implementations, one or more of the bit cells include asymmetrical read access circuits. For example, one or more of the arrays 610A and 610B provide a dual read port and single write port functionality. Accordingly, the memory bit cells include a stack of p-type transistors such as p-type transistors 140 and 142 (of FIG. 1) that control whether the stored binary value affects the pre-charged read bit line 166. In addition, the memory bit cells include a stack of n-type transistors such as p-type transistors 150 and 152 (of FIG. 1) that control whether the stored binary value affects the pre-charged read bit line 168.

The row decoders and word line drivers in blocks 620A-620B receive address information corresponding to an access request. For example, each of the blocks 620A-620B receives the information provided by the access request address 670. Each one of the blocks 620A-620B selects a particular row, or entry, of the multiple rows in an associated one of the arrays 620A-620B. In some implementations, the blocks 620A-620B use an index portion of the address 660 for selecting a given row, or entry, in an associated one of the arrays 620A-620B. Each row, or entry, stores one or more memory lines.

In the implementation shown, the rows, or entries, in the arrays 620A-620B are arranged in a vertical orientation. However, in other implementations, a horizontal orientation is used for storage of the memory lines. For write access requests, the write latches are located in block 650. The write data is driven into the arrays 610A-610B. The timing control logic 640A-640B updates the write latches with new data in block 650 and sets up the write word line driver logic. The write data is written into a row of bit cells that is selected by an associated one of the blocks 620A-620B. In some implementations, pre-charge circuitry is included in block 650.

For read access requests, the block 650 is used to pre-charge the read bit lines routed to the arrays 610A-610B. The timing circuitry in blocks 640A-640B is used for pre-charging and setting up the sense amplifiers in the blocks 630A-630B. The timing circuitry 640A-640B sets up the read word line driver logic. One of the row decoders 620A-620B selects a row to read out data, which will be provided on read bit lines that are sensed by the sense amplifiers. The read latches capture the read data.

Figure 7:
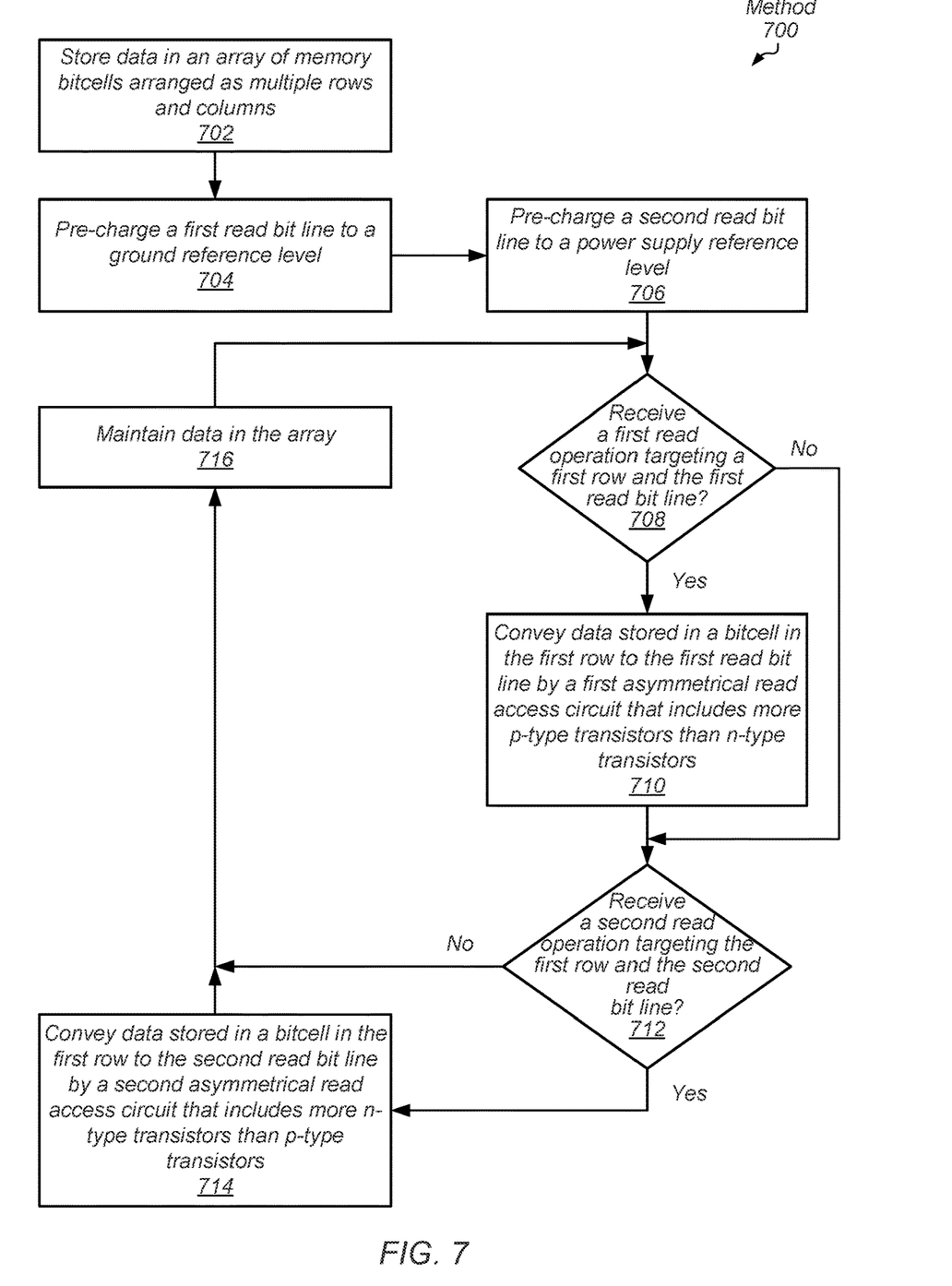
FIG. 7 is a generalized diagram of one implementation of a method for efficiently accessing data stored in a memory bit cell that includes asymmetrical read access circuits and dual read ports.

Referring now to FIG. 7, one implementation of a method 700 for efficiently accessing data stored in a memory bit cell is shown. For purposes of discussion, the steps in this implementation (as well as in FIG. 8) are shown in sequential order. However, in other implementations some steps occur in a different order than shown, some steps are performed concurrently, some steps are combined with other steps, and some steps are absent.

An array of memory bit cells arranged as multiple rows and columns stores data (block 702). In various implementations, the values of the stored data are maintained by data storage loops within the memory bit cells. In addition, the values of the stored data are updated by write operations. In some implementations, the memory bit cells include pass gates and feedback inverters (and feedback tristate inverters) to implement data storage loops and allow updating of the stored values during the write operations. In some implementations, the memory bit cells use the pass gates and feedback inverters of memory bit cell 100 (of FIG. 1) and memory bit cells 380 and 382 (of FIG. 3).

Circuitry external to the memory bit cells pre-charges a first read bit line to a ground reference level (block 704). The circuitry pre-charges a second read bit line to a power supply reference level (block 706). If the array receives a first read operation that targets a first row of the array and targets data to be read out on the first read bit line ("yes" branch of the conditional block 708), then a first asymmetrical read access circuit, which includes more p-type transistors than n-type transistors, conveys data stored in a bit cell in the first row to the first read bit line (block 710). In some implementations, the first asymmetrical read access circuit includes only p-type transistors. For example, the memory bit cell is similar to the memory bit cell 100 (of FIG. 1) that includes the asymmetrical read access circuit 180. The asymmetrical read access circuit 180 includes a stack of p-type transistors such as p-type transistors 140 and 142 that control whether the stored binary value affects the pre-charged read bit line 176.

If the array does not receive a first read operation that targets the first row of the array and targets data to be read out on the first read bit line ("no" branch of the conditional block 708), then control flow of method 700 skips block 710 and moves to the conditional block 712. If the array receives a second read operation that targets the first row and targets data to be read out on the second read bit line ("yes" branch of the conditional block 712), then a second asymmetrical read access circuit, which includes more n-type transistors than p-type transistors, conveys data stored in the bit cell in the first row to the second read bit line (block 714). In some implementations, the second asymmetrical read access circuit includes only n-type transistors. For example, the memory bit cell is similar to the memory bit cell 100 (of FIG. 1) that includes the asymmetrical read access circuit 182. The asymmetrical read access circuit 182 includes a stack of n-type transistors, such as n-type transistors 150 and 152 that control whether the stored binary value affects the pre-charged read bit line 178.

If the array does not receive the second read operation that targets the first row of the array and targets data to be read out on the second read bit line ("no" branch of the conditional block 712), then control flow of method 700 skips block 714 and moves to the block 716. The bit cell maintains a stored binary value (block 716). As described earlier, the bit cell includes a latch element for storing the binary value until the binary value is modified by a write access operation.

Figure 8:
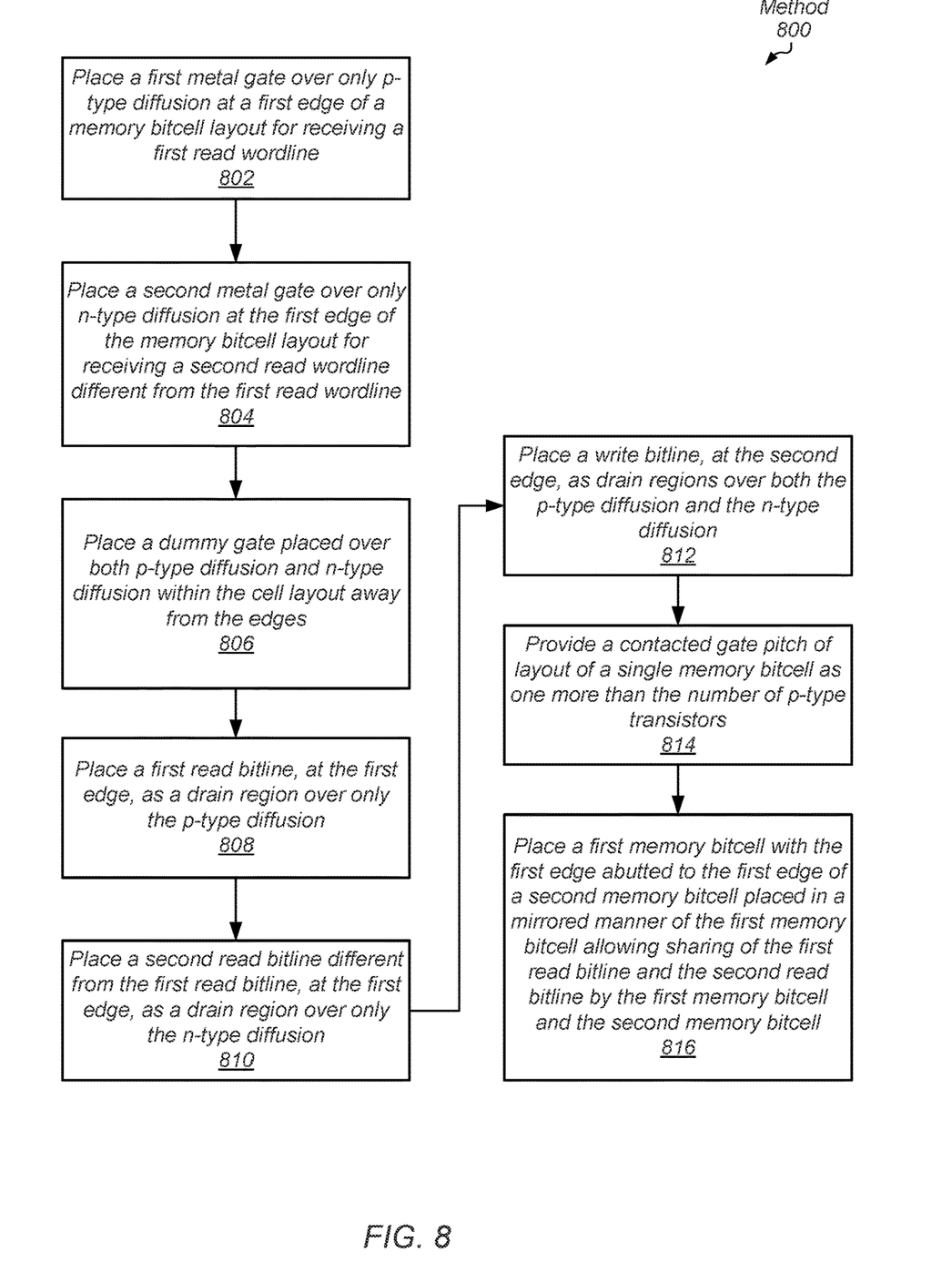
FIG. 8 is a generalized diagram of one implementation of a method for efficiently creating semiconductor layout of a memory bit cell that includes asymmetrical read access circuits and dual read ports.

Referring now to FIG. 8, one implementation of a method 800 for efficiently creating semiconductor layout of a memory bit cell is shown. A first metal gate is placed over only p-type diffusion at a first edge of a memory bit cell layout for receiving a first read word line (block 802). Therefore, the first metal gate is placed over a p-type active region used for creating p-type transistors. A second metal gate is placed over only n-type diffusion at the first edge of the memory bit cell layout for receiving a second read word line different from the first read word line (block 804). Therefore, the second metal gate is placed over an n-type active region used for creating n-type transistors. A dummy gate is placed over both p-type diffusion and n-type diffusion within the cell layout away from the edges (block 806).

Place a first read bit line, at the first edge, as a drain region over only the p-type diffusion (block 808). Place a second read bit line different from the first read bit line, at the first edge, as a drain region over only the n-type diffusion (block 810). Place a write bit line, at the second edge, as drain regions over both the p-type diffusion and the n-type diffusion (block 812).

Provide a contacted gate pitch of layout of a single memory bit cell as one more than the number of p-type transistors (block 814). Place a first memory bit cell with the first edge abutted to the first edge of a second memory bit cell placed in a mirrored manner of the first memory bit cell allowing sharing of the first read bit line and the second read bit line by the first memory bit cell and the second memory bit cell (block 816).

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. A circuit comprising:
   an array of memory bit cells for storing data, wherein a given memory bit cell of the array comprises:
   a data storage circuit;
   a first asymmetrical read access circuit configured to receive a complementary value of the data stored by the data storage circuit; and
   a second asymmetrical read access circuit configured to receive the complementary value of the data stored by the data storage circuit, wherein the second asymmetrical read access circuit comprises more transistors of an n-type or a p-type than the first asymmetrical read access circuit; and
   wherein in response to receiving an indication of a first read operation, the first asymmetrical read access circuit is configured to:
   access the complementary value of the data stored by the data storage circuit; and
   convey data stored by the data storage circuit to a first read bit line.

2. The circuit as recited in claim 1, wherein the circuit further comprises first pre-charge circuitry configured to pre-charge the first read bit line to a ground reference level.

3. The circuit as recited in claim 1, wherein the second asymmetrical read access circuit comprises only n-type transistors.

4. The circuit as recited in claim 3, wherein in response to receiving, concurrently with the first read operation, a second read operation targeting a same row of the array targeted by the first read operation, the given memory bit cell, via the second asymmetrical read access circuit, is configured to:
   access the complementary value of the data stored by the data storage circuit concurrently with the first asymmetrical read access circuit; and
   convey the data stored by the data storage circuit to a second read bit line using the more transistors of an n-type or a p-type than the first asymmetrical read access circuit.

5. The circuit as recited in claim 1, wherein the data storage circuit is coupled to a write bit line via a pass gate comprising a n-type transistor and a p-type transistor.

6. The circuit as recited in claim 1, wherein the first asymmetrical read access circuit comprises only p-type transistors that include:
   a first p-type transistor configured to receive, on its gate terminal, the complementary value of the data stored by the data storage circuit; and
   a second p-type transistor in series with the first p-type transistor configured to:
   receive, on its gate terminal, a read word line as the indication of the first read operation; and
   receive, on its drain terminal, the first read bit line.

7. The circuit as recited in claim 5, wherein a gate of the n-type transistor of the pass gate is coupled to receive a write word line, and a gate of the p-type transistor of the pass gate is coupled to receive a signal with a complementary value of the write word line.

8. The circuit as recited in claim 7, wherein the signal with the complementary value of the write word line is coupled to a gate of an n-type transistor.

9. A method comprising:
   storing data in an array of memory bit cells, wherein a given memory bit cell of the array comprises:
   storing data by a data storage circuit;
   receiving, by a first asymmetrical read access circuit, a complementary value of the data stored by the data storage circuit; and
   receiving, by a second asymmetrical read access circuit, the complementary value of the data stored by the data storage circuit, wherein the second asymmetrical read access circuit comprises more transistors of an n-type or a p-type than the first asymmetrical read access circuit; and
   wherein in response to receiving an indication of a first read operation, performing, by the first asymmetrical read access circuit of the given memory bit cell of the array:
   disabling a pass gate comprising a n-type transistor and a p-type transistor;
   accessing the complementary value of the data stored by the data storage circuit of the given memory bit cell; and
   conveying the data stored by the data storage circuit to a first read bit line.

10. The method as recited in claim 9, further comprising pre-charging, by first pre-charge circuitry, the first read bit line to a ground reference level.

11. The method as recited in claim 9, further comprising receiving the complementary value of the data stored by the data storage circuit by the second asymmetrical read access circuit comprising only n-type transistors.

12. The method as recited in claim 11, further comprising pre-charging a second read bit line to a power supply reference level.

13. The method as recited in claim 12, wherein in response to receiving, concurrently with the first read operation, a second read operation targeting a same row of the array targeted by the first read operation, the method further comprises performing by the second asymmetrical read access circuit:
   accessing the complementary value of the data stored by the data storage circuit; and
   conveying the data stored by the data storage circuit to the second read bit line using the more transistors of an n-type or a p-type than the first asymmetrical read access circuit.

14. The method as recited in claim 9, further comprising:
   receiving, by a gate terminal of a first p-type transistor of the first asymmetrical read access circuit comprising only p-type transistors, a complementary value of the data stored by the data storage circuit;
   receiving, on a gate terminal of a second p-type transistor in series with the first p-type transistor, a read word line as the indication of the first read operation; and
   receiving, by a drain terminal of the second p-type transistor, the first read bit line.

15. The method as recited in claim 9, wherein disabling the pass gate comprising receiving a write word line on a gate of the n-type transistor of the pass gate, and receiving a complementary value of the write word line on a gate of the p-type transistor of the pass gate.

* * * * *